(12) United States Patent
Liaw (10) Patent No.: US 7,405,994 B2
(45) Date of Patent: Jul. 29, 2008

(54) DUAL PORT CELL STRUCTURE

(75) Inventor: Jhon Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 206 days.

(21) Appl. No.: 11/192,715

(22) Filed: Jul. 29, 2005

(65) Prior Publication Data

US 2007/0025132 A1 Feb. 1, 2007

(51) Int. Cl.
*G11C 8/00* (2006.01)
(52) U.S. Cl. ............... 365/230.05; 365/154; 365/63
(58) Field of Classification Search ............ 365/154, 365/230.05, 63
See application file for complete search history.

(56) References Cited

U.S. PATENT DOCUMENTS

| | | | |
|---|---|---|---|
| 5,955,768 A | 9/1999 | Liaw et al. | |
| 5,973,985 A | 10/1999 | Ferrant | |
| 6,370,078 B1 * | 4/2002 | Wik et al. | 365/230.05 |
| 6,498,758 B1 * | 12/2002 | Pomar et al. | 365/214 |
| 6,665,204 B2 * | 12/2003 | Takeda | 365/63 |
| 6,756,652 B2 * | 6/2004 | Yano et al. | 257/508 |
| 6,822,300 B2 | 11/2004 | Nii | |
| 7,023,056 B2 * | 4/2006 | Liaw | 257/369 |
| 7,319,602 B1 * | 1/2008 | Srinivasan et al. | 365/49.1 |
| 2001/0043487 A1 | 11/2001 | Nii et al. | |
| 2003/0048256 A1 * | 3/2003 | Salmon | 345/168 |
| 2004/0120209 A1 | 6/2004 | Lee et al. | |
| 2005/0047256 A1 | 3/2005 | Yang | |
| 2006/0028860 A1 * | 2/2006 | Lien et al. | 365/154 |

OTHER PUBLICATIONS

Nii, Koji, et al., "A 90nm Dual-Port SRAM with 2.04um2 8T-Thin Cell Using Dynamically-Controlled Column Bias Scheme", 2004 IEEE International Solid-State Circuits Conference, Session 27, 2004, pp. 27.9.
Wolf, Stanley, Ph.D., "Silicon Processing for the VLSI Era", vol. 2: Process Integration, 1990, pp. 160-161.
World Wide Web, http://www.hpcwire.com/dsstar/04/0224/107497.html, "Renesas Technology Develops 90nm Dual-Port SRAM for SoC", DSstar, printed on Apr. 6, 2005, 3 pages.

* cited by examiner

*Primary Examiner*—Son Dinh
(74) *Attorney, Agent, or Firm*—Haynes Boone, LLP (57) ABSTRACT

Disclosed are improved layouts for memory cell and memory cell arrays. A memory cell array of multiple memory cells connected by signal lines that twist in connecting the array. Further, an eight transistor memory cell that comprises different resistive paths as seen by the signal lines electrically connected to the cell and asymmetric pass devices associated with those resistive paths. Furthermore, an eight transistor memory cell that includes butt contacts.

21 Claims, 5 Drawing Sheets

DUAL PORT CELL STRUCTURE

CROSS-REFERENCE

This application is related to the following commonly-assigned U.S. Patent Application, the entire disclosure of which is hereby incorporated herein by reference: "SRAM DEVICE HAVING HIGH ASPECT RATIO CELL BOUNDARY," Ser. No. 10/818,133, filed Apr. 5, 2004, having Jhon Jhy Liaw named as inventor.

BACKGROUND

The present disclosure relates in general to semiconductor memory devices.

The physical dimensions of a feature on a chip are referred to as "feature size." Reducing or scaling the feature size on a chip permits more components to be fabricated on each chip, and more components to be fabricated on each wafer, thereby reducing manufacturing costs on a per-wafer and per-chip basis. Memory devices are included in the devices that undergo such scaling to reduce manufacturing costs. In addition to this scaling, layout changes are done to increase the packing density to also allow more components to be fabricated on each wafer. Likewise, other goals that can be accomplished through changes to the layout include facilitating production and improving device performance. However, these layout changes can lead to various performance issues, including speed, noise, or stability challenges, within the memory cell or memory cell arrays.

The challenges in a layout of a dual ported memory cell are especially great. Dual port memory cells are important in that they enable simultaneous accesses from two ports, versus a signal port memory cell in which data reads and writes are performed via a single port. Despite these benefits however, additional challenges are present in dual port cells. For example, the size of a dual port SRAM can often be at least twice the size of a single port SRAM using the same design rules. Therefore, more aggressive layouts are often needed to improve the cost effectiveness, often resulting in further challenges to the cells' performance.

Accordingly, what is needed in the art are memory device layouts that give performance and/or cost improvements.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

It is to be understood that the following disclosure provides different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed. Moreover, the formation of a first feature over or on a second feature in the description that follows may include embodiments in which the first and second feature are formed in direct contact, and may also include embodiments in which additional features may be formed by interposing the first and second features such that the first and second feature may not be in direct contact. Also, it is understood that the present disclosure includes many conventional structures that are well known in the art so they will only be described generally.

Figure 1:
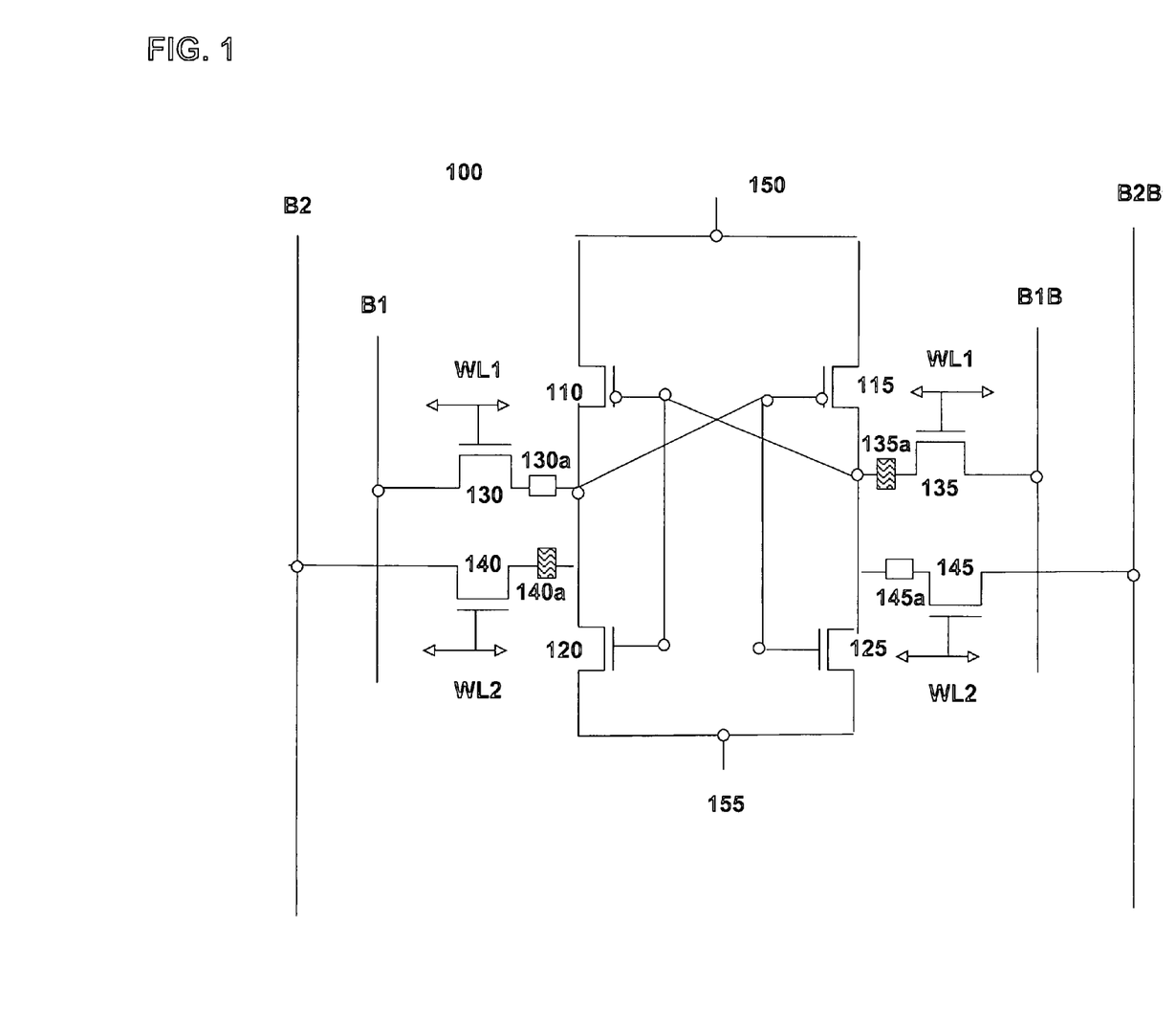
FIG. 1 illustrates a circuit diagram of one embodiment of a dual port memory cell.

Referring to FIG. 1, illustrated is a circuit diagram of one embodiment of a memory cell circuit. The circuit shown is an embodiment of an SRAM dual port eight transistor memory cell, the cell designated by reference numeral 100. The eight transistors here compose a circuit that has 2 cross-latch CMOSFET inverters forming a flip-flop and four pass gate transistors (also known as pass transistors, access transistors, active transistors). Specially, the device 100 includes pull-up transistors 110, 115, and pull-down transistors 120, 125, as well as pass gate transistors 130, 135, 140, 145. Pull-up transistors as defined in this disclosure can be transistors that pull either towards Vcc or Vss. In this embodiment, the memory cell functions by the pull-up transistors pulling toward Vcc. In this dual port device, the first port uses devices 130, 135, 115, 125, while the second port uses devices 135, 145, 110, 120.

The sources of pull-up transistors 110, 115 are electrically coupled to a power source (herein after referred to as Vcc) 150. The drain of the pull-up transistor 110 is electrically coupled to the source of the pass gate transistor 130, the source of pull-down transistor 120, and the gate of pull-up transistor 115. Similarly the drain of pull-up transistor 115 is electrically coupled to the source of pass gate transistor 135, the source of pull-down transistor 125, and the gate of pull up resistor 110. The drains of the pull-down transistors 120, 125 are electrically coupled to a ground, common or Vss (herein after referred to as Vss collectively) 155. Additionally, the gates of pull-up transistor 110 and pull-down transistor 120 and the gates of pull-up transistor 115 and pull-down transistor 125 respectively are electrically coupled.

The drains of pass gate transistors 130, 135 are electrically coupled to a read port bit line B1 and a complementary read port bit line B1B, respectively. The gates of the pass gate transistors 130, 135 are electrically coupled to a word line WL1. The pass gate transistor 145 is electrically coupled in series between the source of pull-down transistor 125 and a second complementary read port bit line B2B, and the gate of the pass gate transistor 145 is electrically coupled to the second port word line WL2. The pass gate transistor 140 is electrically coupled in series between the source of the pull down transistor 120 and a second read port bit line B2, and the gate of the pass gate transistor 140 is electrically coupled to the second word line WL2. The read port bit lines B1, B1B, B2, B2B and the word lines WL1, WL2 may extend to other SRAM cells and or other components including other memory cells.

A possible configuration of a memory cell is one in which there are two different layouts employed as connection paths from where the signal line and its complementary signal line connect to the terminal of the cell. For this cell consequently, there can be different associated resistance paths seen by each of the signal lines for that cell due to the different structure(s) that make up the layout of the paths. One reason for this difference is that it allows for cell size reduction and a variation of the aspect ratio (or the width to length ratio of the cell). For instance, in a cell with an aspect ratio less than one (length greater than width) this would allow for shortened signal lines running parallel to the width of the cell which may increase performance. However, this approach can lead to cell current matching issues between the signal line and its complementary signal line as they see the different resistive paths. This can further lead to memory performance issues that may include the cell's failure to return the correct state.

In cell 100, one embodiment would be to have varying resistance paths as seen by the bit lines (B1, B2) as opposed to the complementary bit lines (B1B, B2B). This is illustrated on the circuit in FIG. 1 (an illustration of the paths is described in more detail using the layout of FIG. 2 below). On the first port, from bit line B1 contact with pass gate transistor 130 to the drain node of pull down transistor 120 is a higher resistance path shown by symbol 130a. The lower resistance path, symbolized by 135a, is from the connection of complementary bit line B1B with pass gate transistor 135 to the drain node of pull down transistor 125. Likewise on the second port, 140a shows a lower resistance path from the connection of the bit line B2 and a higher resistance path from the complementary bit line B2B shown by 145a. This can result in cell current mismatch match between B2 and B2B and between B1 and B1B. The disclosure below illustrates a novel improvement for an issue such as this.

Figure 2:
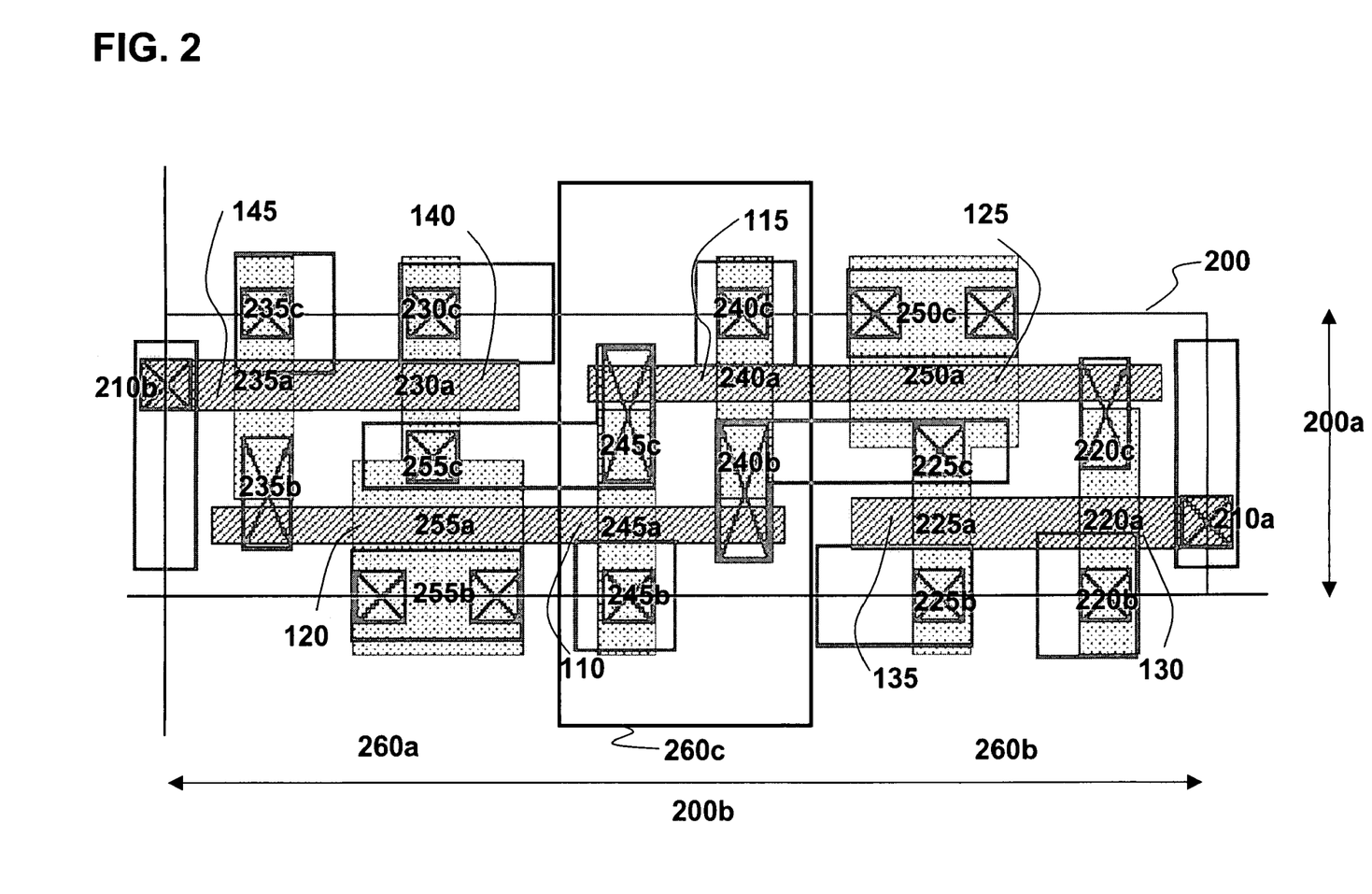
FIG. 2 illustrates one embodiment of a layout view of the memory cell shown in FIG. 1.

FIG. 2, shows one embodiment of the layout view of the dual port cell 100 in FIG. 1. Though the interpretation of this layout is evident to one skilled in the art, the following briefly describes the structures shown. This embodiment shows a N_well region 260c interposing two P_well regions 260a, 260b that are parallel to the width the cell 200a. The bit lines (shown as B1, B1B, B2, B2B on FIG. 1) also run parallel to the width of the cell, while the word lines (shown as WL1, WL2 on FIG. 1) run perpendicular. (Note that the layout view of FIG. 2 does not show the metal layer where the bit lines and word lines run however contacts leading to the lines are shown—the contact with B1 shown at 220b, the contact B1B shown at 225b, the contact with B2 shown at 230c, the contact with B2B shown at 235c, the contact with WL1 at 210a, the contact with WL2 at 210b). P_well 260a contains the layout of devices 145, 140, 120; P_well 260b contains the layout out of 130, 135, 125. Finally, N_well region 260c contains both pull up transistors 110, 115. However, various other layouts would be evident to one skilled in the art.

The highlights of the layout shown in FIG. 2 are described in general as one skilled in the art would be able to interpret the details of the structure. Pass gate transistor 130 layout is shown including its gate 220a shown here in polysilicon and the contact 220b from the drain node of the transistor 130 shown in the active region (also known as diffusion layer or doped layer) with the bit line B1 (See FIG. 1) which runs in this embodiment in a second metal layer (the second metal layer is not shown here, the contact is only shown to the first metal layer). Likewise, pass gate transistor 135 is shown including its gate 225a also in polysilicon and 225b illustrates the contact from the drain node of the transistor 135 in the active region with the complementary bit line for that port B1B (See FIG. 1 as the upper metal layers that include the bit line B1B are not shown in FIG. 2). The first port pull down transistor 125 is shown with its polysilicon gate 250a. Pull up transistors 115, 110 have gates at 240a and 245a respectively. Looking at the second port circuitry in region 260a, the pull down transistor 120 has a gate at 255a. Finally, the pass gate transistors for the second port 140, 145 have respective gates at 230a and 235a. The contacts with the signal line and complementary signal line (FIG. 1 ref. B2, B2B) for the second port are at 230c and 235c respectively. The contacts that lead to the power sources are at 245b (to Vcc), 240c (to Vcc) 250c (to Vss), 255b (to Vss) in this embodiment. Contacts 210a and 210b to a metal layer word line for the first and second port of the memory cell respectively (WL1, WL2 from FIG. 1, the lines are not illustrated in FIG. 2 however as they are on a higher metal layer not shown) from the gate layer of the pass gate transistors 130, 135 and 140, 145 respectively.

From this layout, it is possible to see one embodiment of the use of different associated resistance paths as seen by a bit line and the complementary bit line discussed previously. Using the first port as illustration, the complementary bit line B1B (See FIG. 1) (B1B again is electrically connected to the cell at pass gate transistor 135 shown as contact 225b) sees a lower resistance path from the source of the pass gate transistor 225c to the drain of the pull down transistor 250c. Here this path uses only one structure—the active region. This is compared to the higher resistance seen by the bit line B1 (See FIG. 1) for this port. It is electrically coupled to the cell at pass gate transistor 130, specifically at contact 220b and follows a higher resistance path from the source of the pass gate transistor 220c to the drain node of the pull down transistor 255b. In this embodiment of the layout, that path comprises a multitude of structures including active region, contact, polysilicon, and metal layers. One skilled in the art would recognize there is a multitude of combination of or single layers that would also give this higher resistance including silicide, various contact schemes, metal layers, polysilicon (with silicide or metal). In way of example, silicide may be NiSi, CoSi2, TiSi2, PtSi, WSi2, refractory metal, metal silicide, or a combination thereof. The larger resistance path could also consist of a longer metal gate layer of metal upon a dielectric.

The same difference in resistance paths is seen in this embodiment in the second port with a low resistance path from 255c to 255b through the active region and a higher resistance path through multiple structures with layers including contact, polysilicon, and active region from 235b to 250c. The low resistance path is seen by the bit line B2 (See FIG. 1, using FIG. 2 B2 (though not shown) is electrically connected to the cell at pass gate transistor 140 at contact 230c), and the higher resistance path is seen by the complementary bit line B2B (See FIG. 1, using FIG. 2 B2B (though not shown) is electrically connected to the cell at pass gate transistor 145 at contact 235c) for that second port. For both ports, there is a measurable difference in resistance in the embodiment above, the higher resistance path, with longer poly silicide layer, has a greater than 10 square resistance, while the lower resistance path through active has a less than 5 square resistance. Square resistance is a unit of measure derived from plotting four equidistant points of a square on the material and applying a voltage across two diagonal points and measuring the current across the other diagonal points to find the resistance.

These different paths can exist for a multitude of mutually exclusive reasons including but not limited to: cell size reduction, desired aspect ratio, speed enhancement from shortened signal lines, manufacturing constraints. For instance, the embodiment in FIG. 2 shows the cell boundary 200 is a long, thin device with length 200b being greater than width 200a.

With this boundary size, there can be mutually exclusive benefits of short bit line length, higher speed, higher density on wafer, ease of manufacturing. This rectangular shape in one embodiment would give an aspect ratio (or ratio of width to length or of bit line to word line in the given cell) of less than one-third. However, this layout can lead to mismatch of resistance paths (as the paths use different structures) seen by the signal lines which in turn can lead to issues such as cell current mismatch that may affect performance. For instance in the embodiment of the cell described herein, the cell current for the low resistance path was measured to be 28 µA while the higher resistance path 26 µA.

In order to improve upon the performance, asymmetrical pass gate transistors can be introduced to better balance the currents and resistance of the paths. One manner of accomplishing this asymmetry is increasing the channel width of the first pass gate transistor 130 when compared to the second pass gate transistor 135. The difference ratio of the channel widths can be 5% or 10% taken from as drawn or TEM measurements. The same compensation could be made in the second port by varying the channel width of the transistors 140 and 145 respectively. Other methods of introducing asymmetrical transistors include, but are not limited to, changing the channel length or the depth of the diffused region. One skilled in the art will recognize that other possible performance, manufacturing, or cost considerations may be accomplished by the use of this disclosure mutually exclusive to the specific performance improvement described above.

FIG. 2 also illustrates one embodiment of the additional and related present disclosure of including butt contacts within the dual port memory cell. One possible motivation for using this contact structure in the layout is to reduce the cell size, others include performance and manufacturing considerations. In this embodiment, the butt contacts are illustrated by the contacts at 235b, 245c, 240b, 220c. The contact at 220c in this embodiment is a butt contact connecting the gate layer including 250a with the active region of the source of transistor 130; the contact 235b is a butt contact connecting the active region of source of transistor 145 with the gate layer including 255a. The remaining two butt contact structures, the contacts at 240b and 245c, are in the N_well region 260c connecting the pull up transistors 110, 115. Again these contacts are connecting the gate layer with active region. In this embodiment of the butt contact, or butted contact, polysilicon (forming the gate layer) is aligned with the edge of the active device area to which the contact will be established. The polysilicon and active region of the substrate "butt up" against one another but do not come in electrical contact (as there is a layer of oxide or other dielectric above the substrate and below the polysilicon). Metal is deposited into a contact window that overlaps the polysilicon and active region of the substrate to electrically connect the polysilicon and active regions. This structure can be a standalone hole not connected to any other metal interconnect. In other embodiments of this memory cell, these contacts could instead be butt contacts that do contact a metal layer, a common via metal link to interconnect the layers, buried contacts, or twin contacts that have a connection to the metal interconnect layer among other options known to those skilled in the art.

Figure 3:
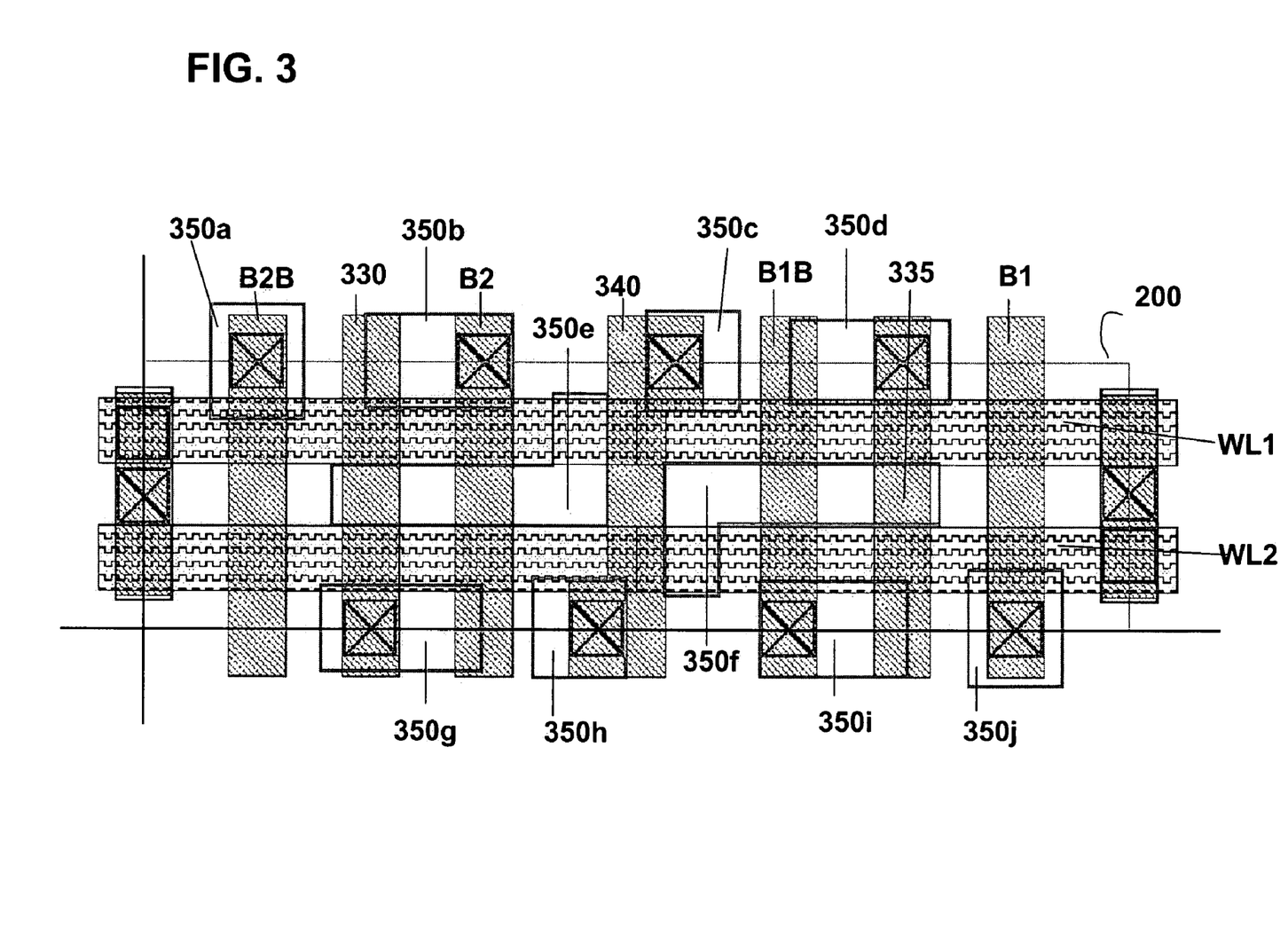
FIG. 3 illustrates one embodiment of a layout view of the memory cell at a subsequent stage of manufacturing.

FIG. 3, shows one embodiment of a layout view of the dual port SRAM in a subsequent stage of manufacturing. The boundary of the unit cell is again shown 200. A second port uses word line WL2; while a first port uses a separate word line WL1. In this embodiment, these are shown in a third metal layer though various other embodiments are possible. Also shown are a first port bit line B1 and complementary bit line B1B and a second port bit line B2 and second port complementary bit line B2B. Vss conductor lines 330 and 335 shield the bit lines: B1 is shielded from B1B and B2 is shielded from B2B respectively. Additionally, Vcc conductor line 340 shields the two ports from interference with one another. This shielding can reduce noise and increase speed. Bit lines B1, B1B, B2, B2B; Vss 330, 335; and Vcc 340 are shown in this embodiment in a second metal layer. However, as one skilled in the art would recognize various embodiments are possible.

Using this cell embodiment as an illustration, it can be seen that the coupling capacitance of a bit line and complementary bit line for a given port would be different as the environment seen by the bit lines are different. Specifically, herein while both the bit lines B1, B2 and complementary bit lines B1B, B2B are on a second metal layer, the lower metal layer (here metal one) layout can affect the coupling as the metal one layer is not uniform below each of the lines (see metal one as shown by 350a-j). As an example, the coupling capacitance difference between B1 and B1B and between B2 and B2B could impact the device performance including speed mismatch and sensing margin issues. In this embodiment, this coupling capacitance difference was measured to be 10%. This issue can arise however when using any memory cell or memory cell array and is not exclusive to the SRAM embodiment shown in herein.

Figure 4:
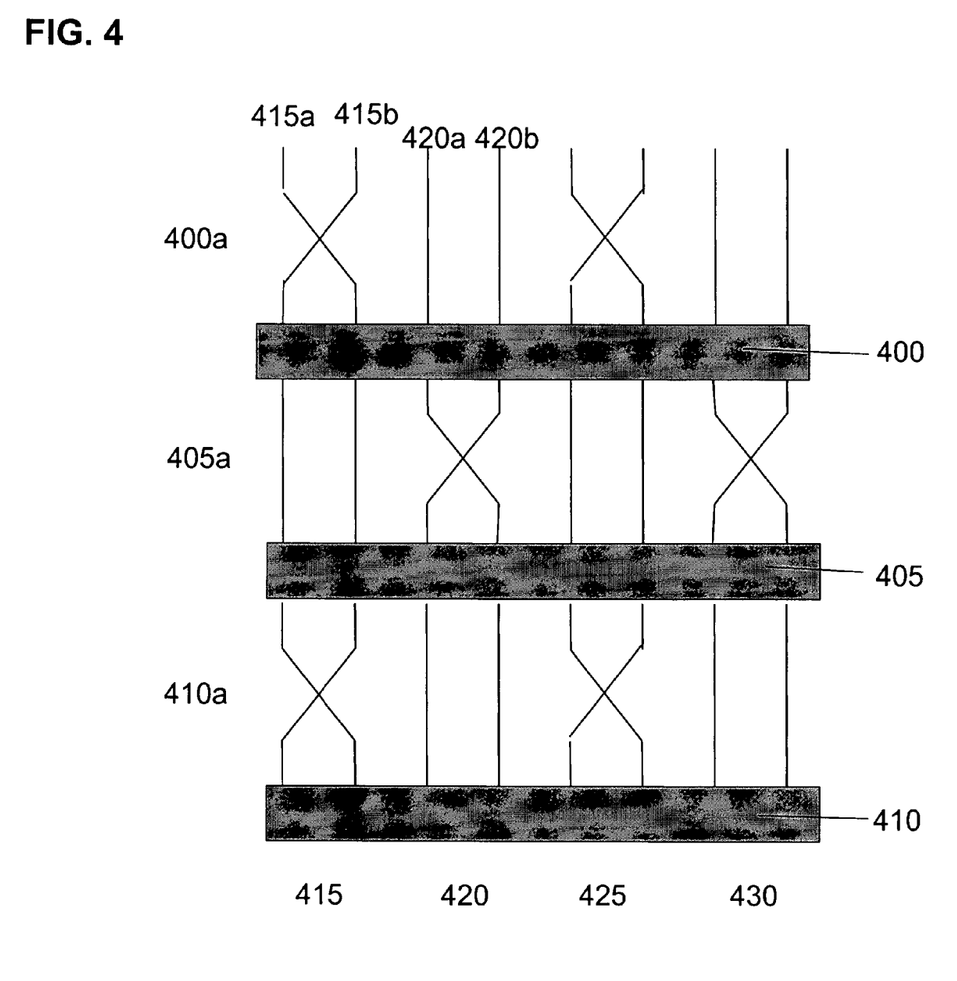
FIG. 4 illustrates a diagram view of an embodiment of a connection of memory cells into an array.

Because of issues such as this coupling capacitance variation, the present disclosure introduces a layout structure in which the signal lines (signal lines as defined here can include bit lines, word lines, data lines, etc) twist. While this can help compensate for the different environments as illustrated above (by the lines in effect switching places through the array so that they experience more similar environments overall), the twisting can also be done for other purposes such as ease of manufacturing, space savings, or to affect various performance aspects of the cell. This twist of signal lines is illustrated in FIG. 4, a diagram of a connection of memory devices into an array. FIG. 4 illustrates three rows of memory cells 400, 405, 410. These memory cells could be dual port SRAM devices such as cell 100, 6 transistor dual port memory devices, single port memory devices, DRAM, ROM, FPGA or any other memory cell variety that can be made into an array. An array is created by having multiple cells arranged into rows (here 400, 405, 410) and columns (here 415, 420, 425, 430) wherein there is a cell at each intersection of a row and column (e.g. the intersection of 400 and 415 would be the first memory device of this array shown). Associated with each row there is a cross-sectional area; in FIG. 4 these are shown as 400a, 405a, 410a. This cross-sectional area could include the row, as well as the area between the rows. An array can be of any size or dimension. In the array shown in FIG. 4, signal lines 415a, 415b are electrically coupled to first and second terminals of the first memory device of this array, as well as to terminals of the devices in the first column 415 of the subsequent rows 405, 410. These signal lines 415a and 415b twist (or as stated in other terms, cross) during the connection of the array. In this embodiment, the signal lines 415a, 415b twist between rows first in the cross-sectional area associated with the first row 400a and again in the area associated with the third row 410a. However, in other embodiments this twisting may occur in other locations, such as within the memory cell or between the rows in other cross-sectional areas. Further in this embodiment, the signal lines 420a, 420b for the next column 420 do not twist in the first cross-sectional area 400a, but do twist in the second cross-sectional area 405a. The frequency and location of the twist of the signal lines is not limited to this embodiment, nor is it required that all signal lines in an array twist. Additionally the disclosure is not limited to one pair of signal lines per column as shown in this diagram. For instance, in a dual port array, there would be four signal lines for each column, two for each port (e.g. column 415 may have two additional lines running parallel to 415a, 415b). The signal line pairs for a multiple port device may twist (one line twisting its complementary line) at the same cross-sectional area as those for the first port, or in different cross-sectional areas.

Figure 5:
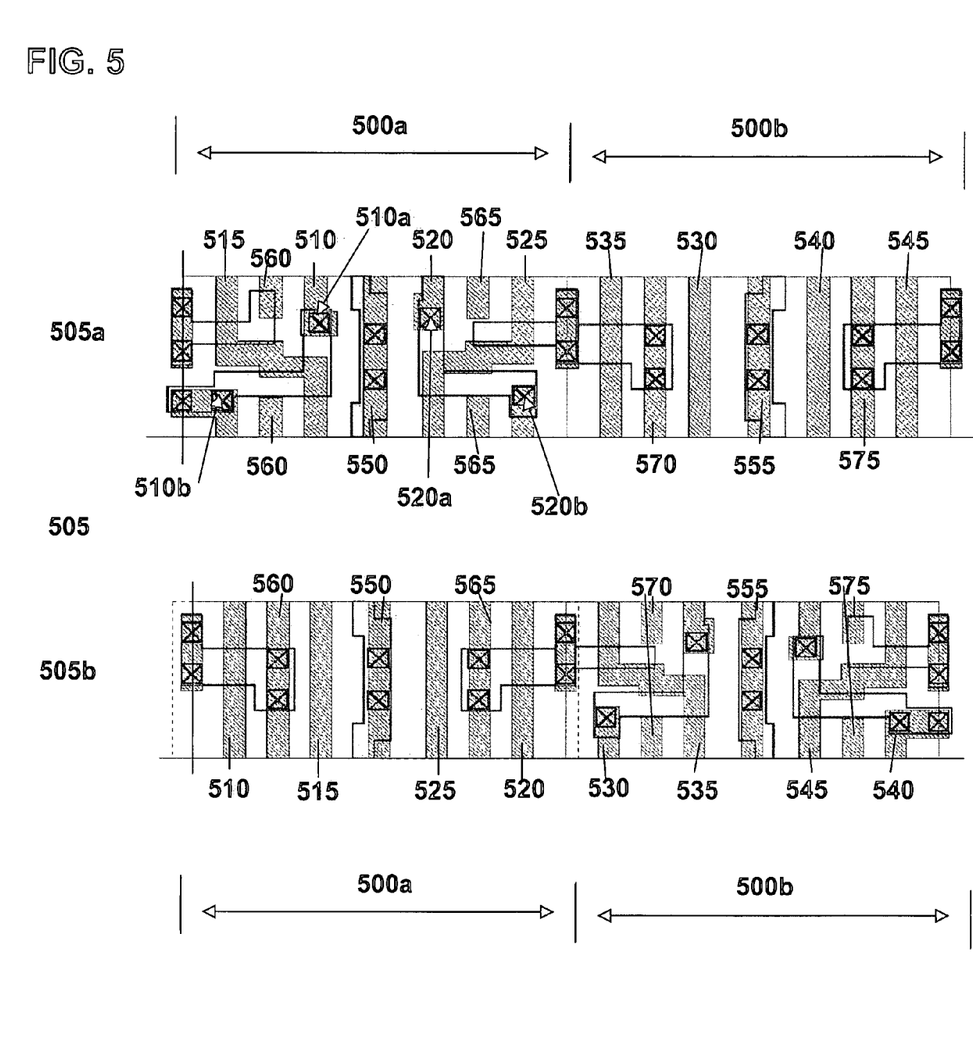
FIG. 5 illustrates a layout view of an embodiment of a connection of dual port memory cells into an array.

FIG. 5 shows one embodiment of a layout view of the twisting of signal lines. This figure shows a two column 500a, 500b and one row 505 array. The devices in row 505 are not illustrated. This embodiment shows the signal lines twisting in the cross-sectional areas 505a, 505b located between the rows. Moreover, this embodiment illustrates the signal lines for an array of dual port devices. Signal lines 515, 510 (associated for example with a first port) twist in the cross-sectional area 505a. In this embodiment both signal lines 515 and 510 are on a second metal layer at the top of the cross-sectional area 505a. Within the area however, signal line 510 at a point marked by 510a is brought to a first metal layer and twisted with signal line 515. Meanwhile, signal line 515 remains on the second metal layer. After twisting with signal line 515, signal line 510 is brought back to the second metal layer at 510b. Both 515, 510 are then able to be electrically coupled to the memory cell in the subsequent row, here cross-sectional area 505. Cross-sectional area 505b shows the layout when the signal lines do not twist; there signal lines 510 and 515 remain on the same metal layer and do not twist one another. A second port signal lines 520, 525 also twist in the cross-sectional area 505a in this embodiment. As shown there signal line 525 remains on a second metal layer while 520 twists with it by moving from the second metal layer to a first metal layer at 520a, twisting with signal line 525, and back moving to the second metal layer at 520b. The twisting could be accomplished by moving to any other layer however and is not exclusive to a lower metal as illustrated here. For example, in this embodiment a third metal or any other conductive layer could be used. Additionally, the signal lines of both ports do not need to twist within the same cross-sectional area as shown here.

The second column 500b shows in cross-sectional area 505a there is no twisting of the signal lines. In this embodiment signal lines 530, 535, 540, 545 remain on a second metal layer. However, as further illustration, in a subsequent cross sectional area 505b, column 500b signal lines 530, 535 and 540, 545 respectively twist again using the metal one layer. Column 500a signal lines 510, 515, 525, 520 do not within cross-sectional area 505b. The structures labeled 560, 565 and 550, 555, 570, 575 are power and ground lines, in this embodiment interspersed with the signal lines in part to enhance performance by reducing noise.

The layers described here are illustrative only and not meant to be limiting. The signal lines could be on any layer and can move to any adjacent, or non-adjacent layer to accomplish the twist. Additionally, this disclosure could be practiced on an array of any size with any memory cell and is not limited to the dual port arrangement shown in this embodiment. The twisting of the cells in the cross-sectional areas shown is illustrative only and the twisting can occur with more or less frequency than illustrated.

What is claimed is:

1. A memory circuit comprising:
    an array of memory cells arranged in one or more rows and one or more columns, wherein each row and each column comprises a plurality of memory cells;
    at least two signal lines extending along each column of memory cells, each of the two signal lines being electrically connected to first and second terminals of each memory cell in the column; and
    a cross-sectional area associated with each row, wherein the two signal lines in a first column twist in a first cross-sectional area, wherein the signal lines are bit lines, the memory cells are dual ported, and each column comprises at least two additional bit lines electrically connected to a third and fourth terminal of each cell in the column.

2. The memory circuit of claim 1 wherein said additional bit lines twist in said first cross-sectional area.

3. A memory circuit comprising:
    an array of dual port memory cells arranged in one or more rows and one or more columns, wherein each row and each column comprises a plurality of memory cells;
    at least two bit lines extending along each column of memory cells, each of the two bit lines being electrically connected to first and second terminals of each memory cell in the column;
    at least two additional bit lines electrically connected to a third and fourth terminal of each cell in the column;
    a cross-sectional area associated with each row, wherein two bit lines in a first column twist in a first cross-sectional area; and
    at least two word lines per row, the first word line being electrically connected to a fifth terminal of each cell in the row, the second word line being electrically connected to a sixth terminal of each cell in the row.

4. The memory circuit of claim 3 wherein each memory cell comprises four pass devices, each of the four pass devices comprising at least two electrodes, and wherein each of the electrodes is connected to at least one of the six terminals.

5. The memory circuit of claim 4 wherein the memory cells are dual ported SRAMs and the pass devices are transistors with the gate electrodes of two transistors connected to the first word line and the gate electrodes of the other two transistors connected to the second word line in the row, and wherein each memory cell has an aspect ratio of less than a third.

6. The memory circuit of claim 4 wherein at least one of said memory cells has different associated resistance paths as seen by two of the bit lines.

7. The memory circuit of claim 4 wherein at least two electrodes for at least two pass devices are butt contact electrodes and wherein each memory cell comprises at least two additional butt contacts.

8. A dual-ported eight transistor memory cell comprising:
    four pass transistors, two pull-up transistors, and two pull-down transistors wherein the connection path between the source node of a first pass transistor and a first pull-down device is a structure of a first resistance and the connection path between the source node of a second pass transistor and a second pull-down device is a structure of a second resistance, wherein the structure of a first resistance is of greater resistance than the structure of a second resistance, and said first and second pass transistors are asymmetrical;
    four bit lines each electrically connected to one of the pass transistors; and
    first and second word lines, the first word line connecting to a first electrode of two of the pass transistors, the second word line connecting to a first electrode of the other two pass transistors.

9. The memory cell of claim 8 wherein the connection path between the source node of a third pass transistor and a second pull-down device is a structure of a third resistance and the connection path between the source node of a fourth pass transistor and a second pull-down device is a structure of a fourth resistance wherein the structure of a third resistance is of greater resistance than the structure of a fourth resistance, and said third and fourth pass transistors are asymmetrical.

10. The memory cell of claim 8 wherein said asymmetry is the first pass transistor having a greater channel width than said second pass transistor.

11. The memory cell of claim 10 wherein said first pass transistor has at least 5% greater channel width than said second pass transistor.

12. The memory cell of claim 8 wherein said memory cell is connected to a second memory cell in an adjacent row by at least two shared signal lines wherein said signal lines twist in the cross-sectional area associated with the row.

13. The memory cell of claim 8 wherein the memory cell has at least four butt contact structures comprising two butt contact from pass transistors to pull-down transistors and two butt contacts between pull-up transistors.

14. A dual-ported eight transistor memory cell comprising:
four pass transistors, two pull-up transistors, and two pull-down transistors, a first butt contact for connecting a first pass transistor and one of the pull-up or pull-down transistors, and a second butt contact connecting a second pass transistor with a second one of the pull-up or pull-down transistors;
first and second word lines, the first word line connecting to a first electrode of two of the pass transistors, the second word line connecting to a first electrode of the other two pass transistors; and
four bit lines, each connecting to one of the pass transistors.

15. The memory cell of claim 14 further comprising:
a third and fourth butt contact connecting the pull-up or pull-down transistors.

16. A dual-ported eight transistor memory cell comprising:
four pass transistors, two pull-up transistors, and two pull-down transistors, a first butt contact for connecting a first pass transistor and one of the pull-up or pull-down transistors, and a second butt contact connecting a second pass transistor with a second one of the pull-up or pull-down transistors, a third and fourth butt contact connecting the pull-up or pull-down transistors, and wherein the connection path between a first pass transistor and a first pull-down device is a structure of a first resistance and the connection path between the second pass transistor and a second pull-down device is a structure of a second resistance wherein the structure of a first resistance is of greater resistance than the structure of a second resistance;
first and second word lines, the first word line connecting to a first electrode of two of the pass transistors, the second word line connecting to a first electrode of the other two pass transistors; and
four bit lines, each connecting to one of the pass transistors.

17. A dual-ported eight transistor memory cell comprising:
four pass transistors, two pull-up transistors, and two pull-down transistors, a first butt contact for connecting a first pass transistor and one of the pull-up or pull-down transistors, and a second butt contact connecting a second pass transistor with a second one of the pull-up or pull-down transistors and a third and fourth butt contact connecting the pull-up or pull-down transistors;
first and second word lines, the first word line connecting to a first electrode of two of the pass transistors, the second word line connecting to a first electrode of the other two pass transistors; and
four bit lines, each connecting to one of the pass transistors,
wherein the butt contacts are standalone holes connecting an active region to a gate layer with no metal layer directly connected to the butt contacts.

18. A memory circuit comprising:
an array of dual port memory cells arranged in rows and columns, wherein each row and each column comprises a plurality of memory cells, wherein at least one of the dual port memory cells comprises a first connection path between a first pass transistor and a first pull-down transistor having a first resistance and a second connection path between a second pass transistor and a second pull-down transistor having a second resistance, wherein the first resistance is greater than the second resistance; and
at least two signal lines extending along each column of dual port memory cells, and electrically connected to a plurality of dual port memory cells, wherein the at least two signal lines in a first column twist in a first cross-sectional area.

19. A dual-ported memory cell comprising:
a first connection path between a first pass transistor and a first pull-down transistor having a first resistance;
a second connection path between a second pass transistor and a second pull-down transistor having a second resistance, wherein the first resistance is greater than the second resistance.

20. The memory cell of claim 19, further comprising:
at least four butt-contacts.

21. The memory cell of claim 19, wherein the first pass transistor and the second pass transistor are asymmetrical.

* * * * *